(12) United States Patent
Kropfitsch et al.

(10) Patent No.: US 9,214,911 B2
(45) Date of Patent: Dec. 15, 2015

(54) SYSTEM AND METHOD FOR ADJUSTING THE SENSITIVITY OF A CAPACITIVE SIGNAL SOURCE

(75) Inventors: Michael Kropfitsch, Koettmannsdorf (AT); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 429 days.

(21) Appl. No.: 13/599,779

(22) Filed: Aug. 30, 2012

(65) Prior Publication Data

US 2014/0064523 A1    Mar. 6, 2014

(51) Int. Cl.
*H03G 1/00*    (2006.01)
*H03G 3/30*    (2006.01)

(52) U.S. Cl.
CPC .......... *H03G 1/0094* (2013.01); *H03G 3/3026* (2013.01); *H03F 2200/03* (2013.01)

(58) Field of Classification Search
CPC ............. H03G 1/05; H03G 1/17; H03G 1/35; H03G 1/64; H03G 1/94; H03G 7/02; H03G 7/05; H03G 7/06; H03G 3/04; H03G 3/08; H03G 3/3031; H04R 3/00; H04R 19/016; H04R 19/04; H04R 2410/01; H04R 2410/03; H04R 2410/05; H03F 3/60
USPC .............. 381/174, 111, 94, 58, 107; 341/158
See application file for complete search history.

(56) References Cited

U.S. PATENT DOCUMENTS

| | | | |
|---|---|---|---|
| 5,399,989 A | 3/1995 | Chern | |
| 7,548,626 B2 * | 6/2009 | Stenberg et al. | 381/113 |
| 7,756,279 B2 | 7/2010 | Deruginsky et al. | |
| 7,929,716 B2 * | 4/2011 | Niwa et al. | 381/113 |
| 8,004,350 B2 | 8/2011 | Draxelmayr | |
| 8,041,056 B2 * | 10/2011 | Kinoshita | 381/113 |
| 8,067,958 B2 | 11/2011 | Draxelmayr | |
| 8,233,643 B1 * | 7/2012 | Markey | 381/122 |
| 2003/0155966 A1 | 8/2003 | Harrison | |
| 2005/0219097 A1 * | 10/2005 | Atriss et al. | 341/144 |
| 2006/0062406 A1 * | 3/2006 | Kinoshita | 381/113 |
| 2006/0083392 A1 | 4/2006 | Akino | |

(Continued)

FOREIGN PATENT DOCUMENTS

DE    20 2011 106 756    4/2012
EP    1906704    4/2008

(Continued)

OTHER PUBLICATIONS

Delbruek, T. et al., "Analog VLSI Adaptive, Logarithmic, Wide-Dynamic-Range Photoreceptor," International Symposium on Circuits and Systems, London, Apr. 1994, pp. 339-342.

(Continued)

*Primary Examiner* — Davetta W Goins
*Assistant Examiner* — Jasmine Pritchard
(74) *Attorney, Agent, or Firm* — Slater & Matsil, L.L.P.

(57) ABSTRACT

In accordance with an embodiment, a system for amplifying a signal provided by a capacitive signal source includes an impedance converter having an input node configured to be coupled to a first terminal of the capacitive signal source, and an adjustable capacitive network having a first node configured to be coupled to a second terminal of the capacitive signal source and a second node coupled to an output node of the impedance converter.

27 Claims, 4 Drawing Sheets

(56) References Cited

U.S. PATENT DOCUMENTS

| | | | |
|---|---|---|---|
| 2008/0075306 A1* | 3/2008 | Poulsen et al. | 381/111 |
| 2009/0134501 A1 | 5/2009 | Ganitzer et al. | |
| 2011/0142261 A1* | 6/2011 | Josefsson | 381/107 |
| 2011/0150243 A1 | 6/2011 | Onishi | |
| 2011/0175243 A1 | 7/2011 | Jo et al. | |
| 2013/0051582 A1 | 2/2013 | Kropfitsch et al. | |
| 2013/0136267 A1 | 5/2013 | Hammerschmidt et al. | |
| 2013/0271307 A1 | 10/2013 | Kropfitsch et al. | |
| 2013/0287231 A1 | 10/2013 | Kropfitsch | |
| 2015/0137834 A1* | 5/2015 | Steiner | 324/686 |

FOREIGN PATENT DOCUMENTS

| | | |
|---|---|---|
| KR | 20060113925 A | 11/2006 |
| WO | WO 2009/135815 | 11/2009 |
| WO | 2011114300 A1 | 9/2011 |

OTHER PUBLICATIONS

Feng, P., et al. "History of the High-Voltage Charge Pump," Charge Pump Circuit Design, Chapter 1, Jul. 20, 2010, 9 pp.

Harrison, R. et al., "A Low-Power Low-Noise CMOS Amplifier for Neural Recording Applications," IEEE Journal of Solid-State Circuites, vol. 38, No. 6, Jun. 2003, pp. 958-965.

Harrison, R., "Integrated Circuits for Neural Interfacing," Circuits for Emerging Technologies, Feb. 15, 2008, 12 pp.

Vittoz, E. et al. "CMOS Analog Integrated Circuits Based on Weak Inversion Operation," IEEE Journal of Solid-State Circuits, vol. SC-12, No. 3, Jun. 1977, pp. 224-231.

* cited by examiner

SYSTEM AND METHOD FOR ADJUSTING THE SENSITIVITY OF A CAPACITIVE SIGNAL SOURCE

TECHNICAL FIELD

This invention relates generally to semiconductor circuits and methods, and more particularly to a system and method for adjusting the sensitivity of a capacitive signal source.

BACKGROUND

Audio microphones are commonly used in a variety of consumer applications such as cellular telephones, digital audio recorders, personal computers and teleconferencing systems. In particular, lower-cost electret condenser microphones (ECM) are used in mass produced cost sensitive applications. An ECM microphone typically includes a film of electret material that is mounted in a small package having a sound port and electrical output terminals. The electret material is adhered to a diaphragm or makes up the diaphragm itself. Most ECM microphones also include a preamplifier that can be interfaced to an audio front-end amplifier within a target application such as a cell phone. Another type of microphone is a microelectro-mechanical Systems (MEMS) microphone, which can be implemented as a pressure sensitive diaphragm is etched directly onto an integrated circuit.

Environmental sound pressure levels span a very large dynamic range. For example, the threshold of human hearing is at about 0 dBSPL, conversational speech is at about 60 dBSPL, while the sound of a jet aircraft 50 m away is about 140 dBSPL. While the diaphragm of a microphone, such as a MEMS microphone, may be able to withstand high intensity acoustic signals and faithfully convert these high intensity acoustic signals into an electronic signal, dealing with such high-level signals poses some difficulties. For example, many amplifiers and preamplifiers for acoustic microphones are optimized for a particular dynamic range. As such, these systems may not be able to handle the full audio range without adding significant distortion.

In addition, the parameters affecting the uniformity of MEMS devices may cause variation in gain and performance of MEMS devices. Such parameters, including, for example, mechanical stiffness, electrical resistance, diaphragm area, and air gap height, may vary by as much as +/−20%. Such parametric variation is particularly significant in a high voltage and low cost MEMS manufacturing process.

SUMMARY OF THE INVENTION

In accordance with an embodiment, a system for amplifying a signal provided by a capacitive signal source includes an impedance converter having an input node configured to be coupled to a first terminal of the capacitive signal source, and an adjustable capacitive network having a first node configured to be coupled to a second terminal of the capacitive signal source and a second node coupled to an output node of the impedance converter.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a feedback circuit that may be used to adjust the sensitivity of a capacitive signal source such as a MEMS microphone. The invention may also be applied, however, to other types of circuits and systems, such as audio systems, communication systems, sensor systems and other systems that interface with MEMS devices, capacitive sensors, or other capacitive circuits.

Figure 1:
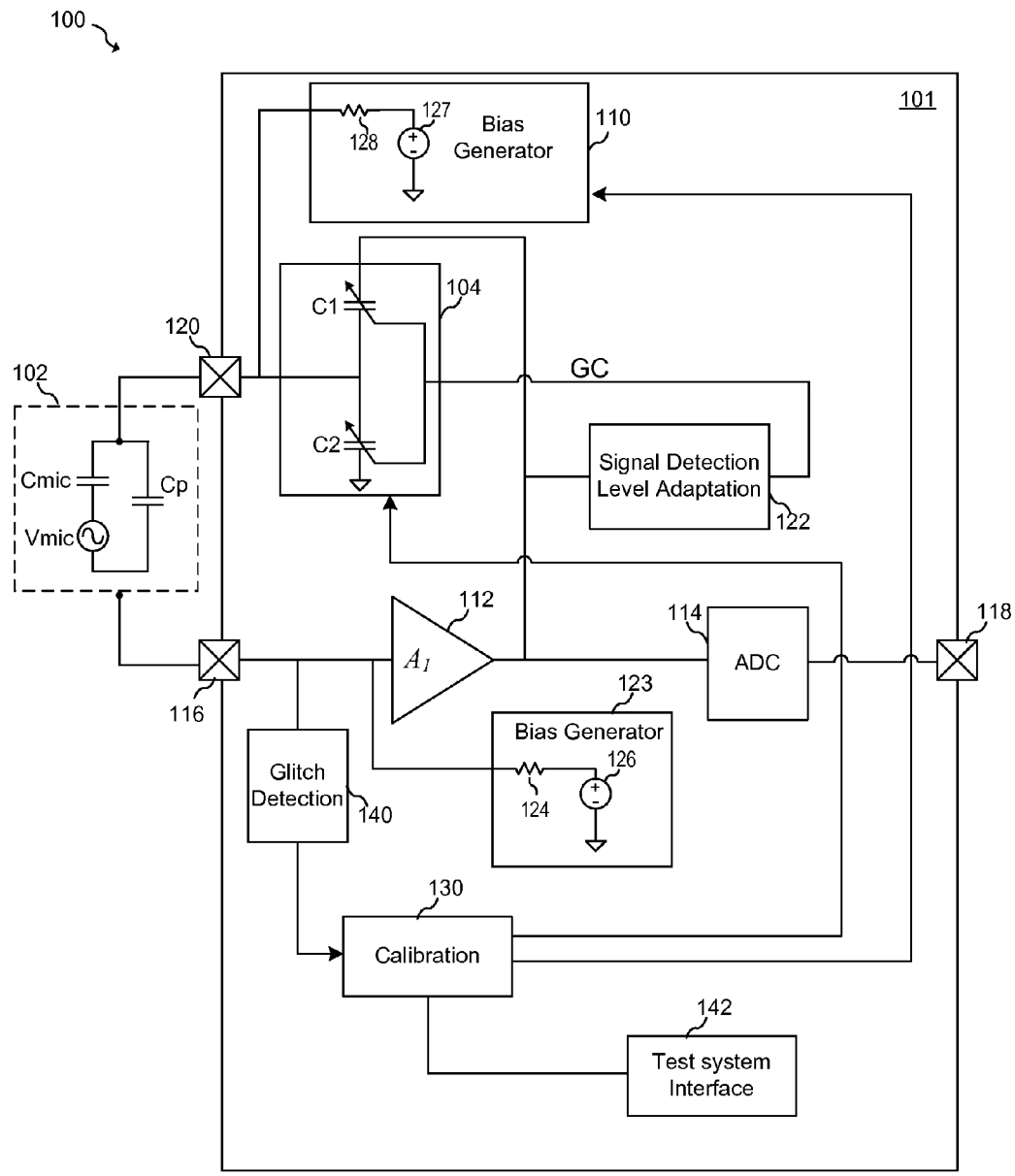
FIG. 1 illustrates an embodiment system for amplifying the output of a capacitive sensor.

FIG. 1 illustrates system 100 having embodiment amplifier integrated circuit (IC) 101 configured to be coupled to MEMS microphone 102, which is shown in dotted lines to indicate that microphone 102 is not necessarily included on IC 101. In some embodiments, microphone 102 may also be included on IC 101 or on a separate die housed within the same package. In alternative embodiments, other types of capacitive sensor circuits may be used in place of MEMS microphone 102. MEMS microphone 102 is shown modeled as voltage source Vmic coupled in series with microphone capacitance Cmic and coupled to pins 116 and 120 of IC 101. Capacitance Cp represents a parallel parasitic capacitance.

IC 101 has amplifier 112, analog to digital converter (A/D) 114, signal detection and level adaptation block 122, adjustable capacitive network 104, bias generator 123 that biases the input of amplifier 112, and bias generator 110 that biases MEMS microphone 102 via pin 120. In an embodiment, amplifier 112 is an amplifier having a gain of unity or less, and having a high input impedance and a low output impedance. Alternatively, amplifier 112 may have a voltage gain greater than one. In some embodiments, amplifier 112 may be implemented using a MOS source follower circuit, or other circuits that operate according to source follower concepts.

Adjustable capacitive network 104 is coupled to the output of amplifier 112 and includes adjustable capacitors C1 and C2 that may be implemented using switchable capacitor arrays. In some embodiments, a gain adaptation of between about −6 dB and about 10 dB may be achieved for a total controllable gain range of about 16 dB. Alternatively, other controllable gain ranges outside of this range may be achieved.

Bias generator 123, which is represented as DC voltage source 126 coupled in series with resistor 124, provides a bias voltage to the input of amplifier 112. In some embodiments, resistor 124 has a high resistance value in order to maintain a high input impedance at audio frequencies. For example, in some embodiments, the resistance value is set such that the input to amplifier 112 has a high pass corner frequency of between about 100 mH and about 20 Hz depending on the application and its particular specifications. This high pass corner frequency may be inversely proportional to the RC time constant of the input biasing resistor and the MEMS microphone capacitance Cmic. Alternatively, other high pass corner frequencies outside of this range may also be used. The voltage of DC voltage source 126 may be set according to the input voltage requirements of amplifier 112.

In an embodiment, ADC 114 outputs a digital representation of the signal output of amplifier 112. This digital representation may be in the form of a digital word, a bitstream, or a pulse width modulated representation of the microphone signal at output pad 118, as described in co-pending application Ser. No. 13/447,792, entitled System and Method for High Input Capacitive Signal Amplifier, filed on Apr. 16, 2012, which application has been incorporated by reference herein in its entirety. Alternatively, an analog representation of the microphone signal may be coupled to output pad 118.

In some embodiments that utilize a MEMS microphone, bias generator 110, which is represented as DC voltage source 127 coupled in series with resistor 128, provides a bias voltage for microphone 102 at pin 120. This bias voltage may be between about 3V and about 16V depending on the particular microphone and system implementation. Alternatively, other voltage ranges may be used. Bias generator 110 may be implemented using circuit techniques known in the art. For example, in some embodiments, bias generator 110 may be implemented using a charge pump. In some embodiments this bias voltage may be adjustable and may be implemented as described in co-pending application number (2012 P 50197) Ser. No. 13/460,025, entitled System and Method for a Programmable Voltage Source, filed on Apr. 30, 2012, which application has been incorporated by reference herein in its entirety. Alternatively, other biasing structures and/or a fixed bias voltage may be used.

In an embodiment, signal detection and level adaptation block 122 measures an amplitude at the output of amplifier 112, and calculates gain control signal GC as a function of the measured amplitude. Gain control signal GC controls adjustable capacitive network 104, thereby adjusting the gain of the system. By varying the capacitance of capacitors C1 and/or C2, the signal level at the output of amplifier 112 is adjusted. In an embodiment, the amplitude of a voltage at the output of amplifier 112 with respect to an acoustic input to MEMS microphone 102 is proportional, at a first order, to about 1+C1/C2.

Signal detection and level adaptation block 122 may contain a peak detector and control logic (not shown) that determines gain control signal GC. In some embodiments, signal detection and level adaptation block 122 decreases the sensitivity of the system at increased acoustic amplitudes and increases the sensitivity of the system at decreased acoustic amplitudes in order to map a high acoustic dynamic range into a smaller electrical dynamic range. Signal detection and level adaptation block 122 has a linear transfer characteristic. In some embodiments, a reduction of gain in the analog domain may be corrected by an increase in gain in the digital domain as described in co-pending application Ser. No. 13/447,792 cited above. The peak detector, control logic and other circuitry present in signal detection and adaptation block 122 may be implemented, for example, as described in co-pending application Ser. No. 13/217,890, entitled System and Method for Low Distortion Capacitive Signal Source Amplifier, filed on Aug. 25, 2011, which application is incorporated by reference herein in its entirety. Alternatively, other gain control circuitry and methods known in the art may also be used.

In some embodiments, calibration block 130 may also be included to calibrate the sensitivity of MEMS microphone 102 via adjustable capacitor network 104. For example, during the manufacture of system 100, the sensitivity may be adjusted in order to provide a nominal sensitivity within a predetermined tolerance. This MEMS calibration process may be performed in one or two steps. In a first optional step, the voltage output by DC bias voltage generator block 110 may be increased up to a pull-in voltage event. In this case, the two plates of the sensor collapse, and a voltage glitch is generated at the input of the buffer 112, which is detected by glitch detection circuit 140. Next, a defined fraction of the DC bias voltage is derived out of the pull in voltage and stored in one or more non-volatile memory cells located, for example, in calibration block 130.

In the second step, a predetermined acoustical signal is applied to MEMS microphone 102, and the resulting amplitude at the output of amplifier 112 is measured, for example, using peak detectors within signal detection level adaptation block 122. This measurement is then compared to a predetermined threshold. In some embodiments, this comparison may be performed outside of the chip via test system interface 142.

In some embodiments, calibration block 130 adjusts the values of C1 and C2 until the measured amplitude at the output of amplifier 112 falls within a range of the predetermined threshold, or until the measured amplitude exceeds the predetermined threshold. In further embodiments, calibration block 130 may be used to adjust a gain curve in order to calibrate the operation of signal detection and level adaptation block 122. In some embodiments, calibration values derived by calibration block 130 may be written to a memory, such as a non-volatile memory, and/or be entered into a lookup table for use by the system. Calibration systems and methods may be implemented according to co-pending application Ser. No. 13/305,572, entitled Microphone and Method for Calibrating a Microphone, filed on Nov. 28, 2011, which application is incorporated by reference herein in its entirety. Alternatively, other calibration circuits and methods may be used.

It should be further appreciated that the components on IC 101 may be implemented using more than one component and/or more than one IC in alternative embodiments.

Figure 2:
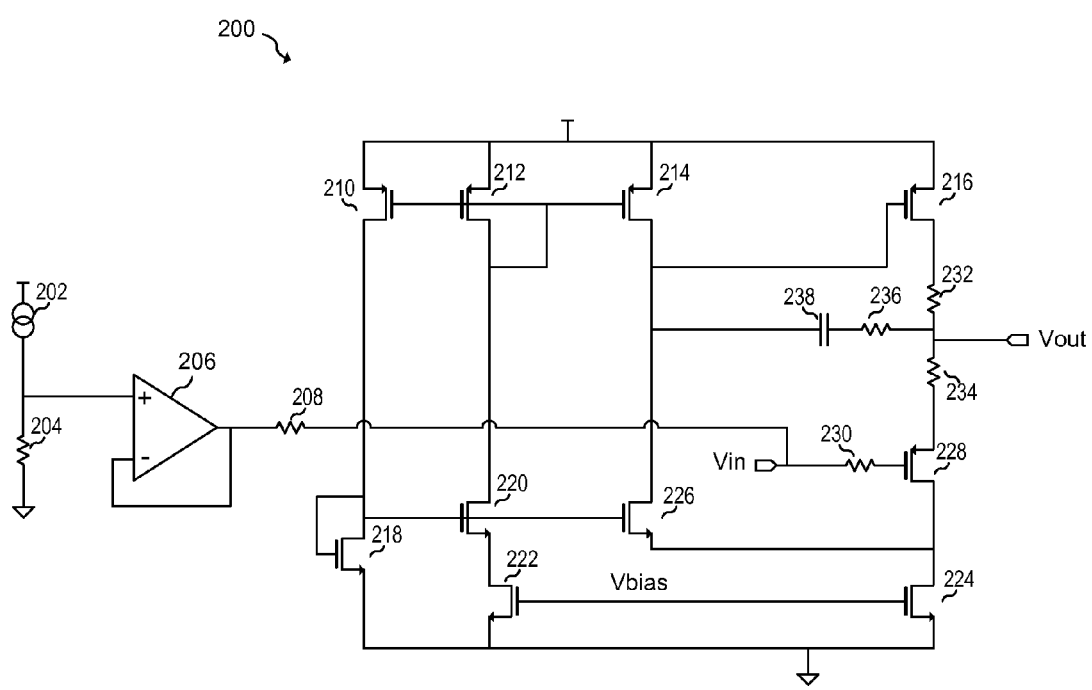
FIG. 2 illustrates a schematic of an embodiment buffer.

FIG. 2 illustrates a schematic of embodiment buffer or impedance converter 200. At a basic level, buffer 200 has PMOS source follower transistor 228 that buffers a voltage at node Vin and provides a lower impedance buffered voltage at node Vout. In alternative embodiments of the present invention, an NMOS source follower may be used instead of PMOS source follower 228.

NMOS current source transistor 224 provides a bias current to PMOS source follower transistor 228, and NMOS cascode transistor 226 provides a low impedance at the drain of PMOS source follower 228. A feedback loop made of PMOS devices 214 and 216 and NMOS devices 226 and 228 adjusts the voltage at the gate of PMOS transistor 216 to source enough current such that the sum of currents though PMOS device 214, PMOS device 216 and any current lost through node Vout is about equal to the current sourced by NMOS device 224. NMOS device 226 and PMOS device 214 are biased with a bias network including PMOS transistors 210, 212, and NMOS transistors 218, 220 and 222. Voltage Vbias is provided by a bias generator, such as a current source coupled to a diode connected NMOS transistor (not shown). Resistor 230 in series with the gate capacitance of source follower transistor 228 realizes a low pass filter for high frequency noise, since the MEMS microphone may act as an antenna in some cases. For example, in cellular telephone applications, signal from the antenna of the cellular phone may be coupled to the input of the amplifier via the MEMS microphone. In some embodiments, the low pass filter is configured to filter noise and disturbances in the 800 MHz to 1900 MHz range and above. Alternatively, other frequency ranges may be attenuated.

In an embodiment, series resistors 232 and 234 are provided to meet ESD requirements without increasing the output impedance of the buffer. Because resistors 232 and 234 are within the feedback loop, their resistance is divided by the loop gain. Capacitor 238 in series with resistor 236 may be used to compensate the feedback loop that controls the current though transistor 216.

In an embodiment, input node Vin is biased by operational amplifier 206 that buffers reference voltage VR generated by current source 202 and resistor 204. In some embodiments voltage VR may be generated using a bandgap voltage generator or other voltage reference circuit known in the art. Resistor 208 has a high resistance value in order to provide a high enough impedance to microphone 102 (FIG. 1). In some embodiments, this resistance value may be between about 50 GΩ and about 300 GΩ. Alternatively, resistances outside of this range may also be used. Resistor 208 is implemented using resistive layer available in the particular process technology being used and/or a long channel MOSFET device biased to provide a high resistance.

Figure 3A:
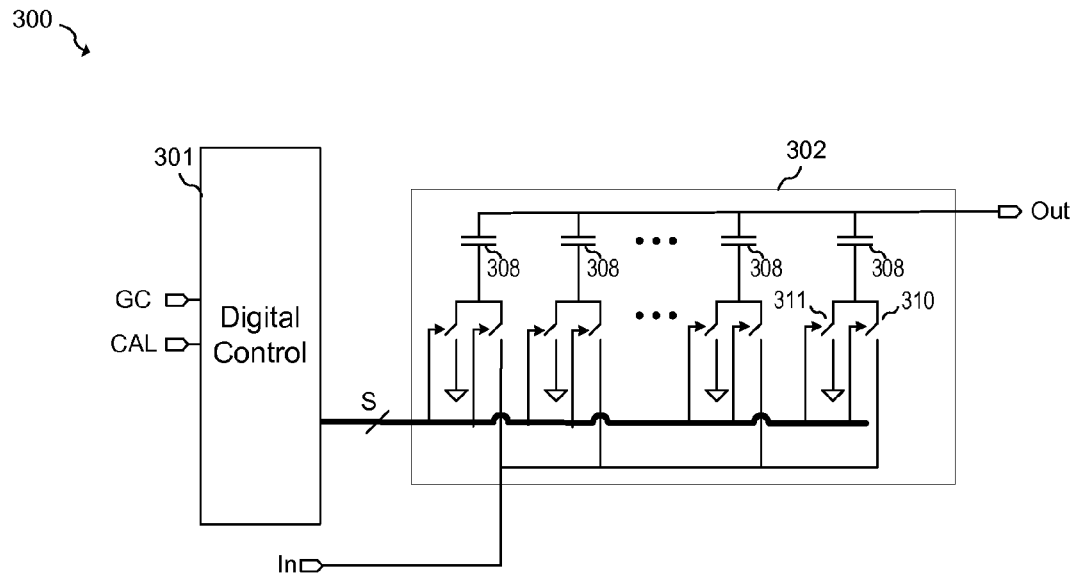
FIGS. 3a-b illustrate an embodiment adjustable capacitance network and its associated control blocks.

FIG. 3a illustrates embodiment adjustable capacitor network 300 that includes capacitor array 302 that may be used to implement adjustable capacitances C1 and C2 shown in FIG. 1. Capacitor array 302 has a plurality of capacitors 308 that are each coupled to a switch 310 and a switch 311. Each switch 310 is switchably coupled to input node In, and each switch 311 is switchably coupled to ground or to another reference node. Output node Out is coupled to the top plates of capacitors 308 and may be coupled to MEMS microphone 102 via pin 120 shown in FIG. 1. Input node In may be coupled to the output of amplifier or buffer 112. In some embodiments, the top plates of capacitors 308 are coupled to node Out and the bottom plates of capacitors 308 are coupled to switches 310 and 311. Alternatively, other configurations may be used.

Capacitors 308 may be configured to have equal values or scaled values depending on the application and its specification in some embodiments. Capacitor array 302 may be implemented using a binary weighted capacitor array. Alternatively, other weightings may be possible, such as logarithmically weighted capacitor values. In some embodiments, capacitors are implemented using unit value capacitors having values between about 100 fF and about 500 fF, depending on the application and its particular specifications, and the particular tolerances of the semiconductor process being used. While only four switchable capacitors are illustrated in FIG. 3a, any number of capacitors may be used depending on the particular embodiment and its specifications.

Digital control block 301 controls the state of switches 310 and 311 in capacitor array 302 using digital control bus S. In an embodiment, digital control block 301 translates gain control signal GC into signals on bus S. Calibration signal CAL may be used by calibration block 130 shown in FIG. 1 in order to calibrate the nominal level of the MEMS microphone and/or to calibrate the relative level shape of the gain control curves implemented by signal detection and level adaptation block 122 also shown in FIG. 1.

Figure 3B:
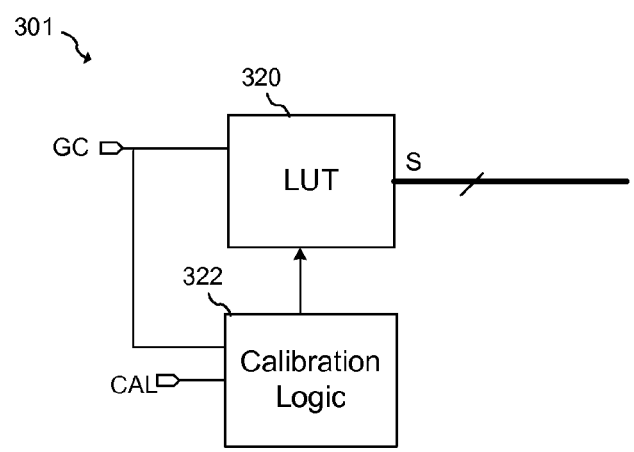

FIG. 3b illustrates a block diagram of embodiment digital control block 301. Digital control block 301 includes lookup table 320 that maps gain control signal GC into switch control buses S1 and S2, as well as calibration logic 322 that adjusts the contents of lookup table 320 according to embodiment calibration methods. In alternative embodiments of the present invention, digital control block 301 may be implemented using other topologies. For example instead of or in addition to using lookup table 320, a digital processor, or custom digital logic may be used to create determine the outputs of switching buses S1 and S2.

Figure 4:
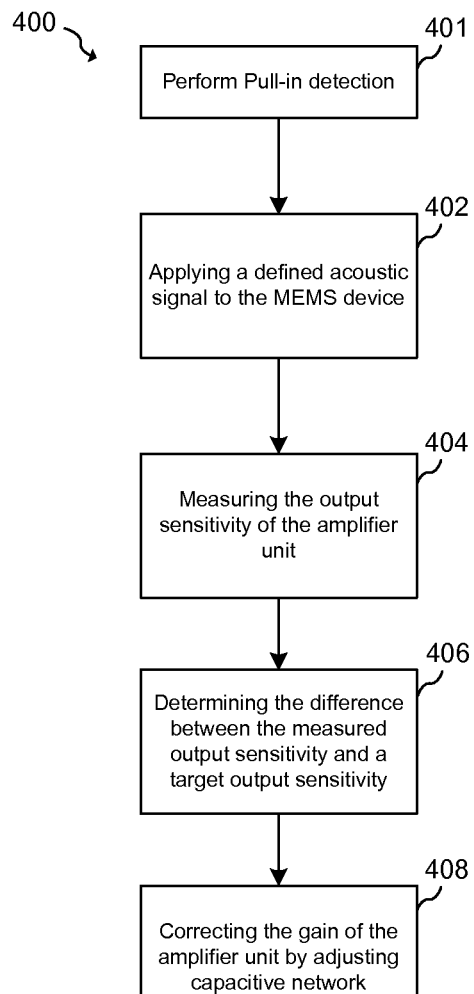
FIG. 4 illustrates an embodiment method.

FIG. 4 illustrates flow chart 400 of an embodiment calibration method. In optional first step 401, a pull in voltage detection for microphone bias voltage adaption is performed. In this step, the collapse voltage (pull-in voltage) is detected, since this value is a measure for the sensitivity of the MEMS microphone. Here, a DC bias voltage of the MEMS microphone is increased until the two plates are collapsed. The final DC bias voltage is a fraction of the detected pull-in voltage and is stored in a memory cell within the ASIC. The defined stored DC bias voltage is then applied to the MEMS microphone.

Next, in step 402, the nominal level of a system including a MEMS microphone and an embodiment amplification system is calibrated by applying a defined acoustic signal to the MEMS device. In step 404, the output sensitivity of the amplifier unit is measured, and in step 406, the difference between the measured output sensitivity and a target output sensitivity is determined. Lastly, the gain of the amplitude unit is corrected in step 408, for example, by adjusting the capacitance of an embodiment capacitive network and storing the final gain settings in one or more non-volatile memory cells. In some embodiments, multiple steps may be used to determine a capacitance setting for a target sensitivity value. For example, in some embodiments, multiple measurements and adjustments may be made until the system converges toward a solution.

The method shown in FIG. 4 may also be used to calibrate a gain control function. For example, one or more points in the gain curve may be calibrated using the method shown in flow chart 400. If a subset of points in the gain curve is calibrated, remaining points in the gain curve may be derived using interpolation in some embodiments.

In some embodiments, a collapse or pull-in voltage is determined prior to setting a nominal level. This may be accomplished by increasing the DC bias voltage of the MEMS microphone until the two plates are collapsed. The final DC bias voltage is a fraction of the detected pull-in voltage. Once this fraction is determined, the final DC bias voltage is applied to the MEMS microphone, and the calibration procedure outlines in FIG. 4 is performed.

In accordance with an embodiment, a system for amplifying a signal provided by a capacitive signal source includes an impedance converter having an input node configured to be coupled to a first terminal of the capacitive signal source, and an adjustable capacitive network having a first node configured to be coupled to a second terminal of the capacitive signal source and a second node coupled to an output node of the impedance converter. The adjustable capacitive network may include a first capacitor coupled between the first node and the second node, and a second capacitor coupled between the first node and a reference node, wherein at least one capacitor of the first capacitor and the second capacitor comprises an adjustable capacitor. The adjustable capacitor may include a plurality of capacitors selectively coupled in parallel via a corresponding plurality of switches, and the second node may be a ground node or other reference voltage. Furthermore, each of the plurality of capacitors may have a top plate coupled to the first node of the capacitive network. In some embodiments, the system may also include the capacitive signal source, which may be a MEMS microphone.

In an embodiment, the system may further include a gain control circuit configured to measure an amplitude of a signal at the output node of the impedance converter and adjust a capacitance of the capacitive network based on the measured amplitude. The system may also include a calibration circuit coupled to the adjustable capacitive network, such that the calibration circuit is configured to adjust a capacitance of the adjustable capacitive network.

In an embodiment, the calibration circuit is further configured to increase a bias voltage configured to be coupled to the capacitive signal source until a voltage glitch is detected from the capacitive signal source to determine a first voltage, determine a final DC bias voltage based on the first voltage, apply the determined final DC bias voltage to the capacitive signal source. The calibration circuit may include a lookup table circuit and/or memory cells configured to store a calibration setting.

In accordance with a further embodiment, an integrated circuit includes a voltage buffer having an input node configured to be coupled to a first terminal of a MEMS microphone, and an adjustable capacitive network having a first node configured to be coupled to a second terminal of the MEMS microphone, a second node coupled to an output node of the voltage buffer, an adjustment input configured to adjust a capacitance of the adjustable capacitive network. The integrated circuit may further include a gain control circuit having an input node coupled to an output of the voltage buffer and an output coupled to the adjustment input of the adjustable capacitive network. The gain control circuit may be configured to measure an amplitude of a signal at the output of the voltage buffer and adjust the capacitance of the capacitive network based on the measured amplitude.

In an embodiment, the voltage buffer is implemented using a MOS source follower. In some cases, the voltage buffer may have voltage gain of 1 or less.

In an embodiment, the adjustable capacitive network has a first capacitor array that includes a plurality of first capacitors having first plates coupled to the first node of the adjustable capacitive network, and a corresponding plurality of switches coupled to second plates of the first plurality of capacitors. The first plates of the plurality of first capacitors may be top plates of the plurality of first capacitors.

In an embodiment, the adjustable capacitive network includes a first adjustable capacitor coupled between the first node of the adjustable capacitive network and the second node of the adjustable capacitive network, and a second adjustable capacitor coupled between the first node of the adjustable capacitive network and a reference node.

In a further embodiment, the adjustable capacitive network includes a plurality of capacitors that each have a top plate coupled to the first node of the adjustable capacitive network, and bottom plate. The bottom plate of each of the plurality of capacitors is configured to be switchably coupled to a reference node and to the second node of the adjustable capacitive network.

In some embodiments, the integrated circuit also includes the MEMS microphone and/or an analog-to-digital converter coupled to the output of the voltage buffer.

In accordance with a further embodiment, a method of calibrating a MEMS microphone having a first node coupled to voltage buffer circuit includes applying an acoustic signal to the MEMS microphone, measuring a sensitivity of the MEMS microphone and the voltage buffer circuit, correcting a gain of the MEMS microphone and the voltage buffer circuit. Correcting the gain may include adjusting a capacitance of a capacitive network coupled between an output of the voltage buffer circuit and a second node of the MEMS microphone.

In an embodiment, the method further includes determining a difference between the measured sensitivity of the MEMS microphone and the voltage buffer circuit and a target output sensitivity. Correcting the gain may include selecting a switching configuration of a switchable capacitor array disposed within the capacitive network. In some embodiments, selecting a switching configuration includes configuring a digital lookup table.

In an embodiment, the method may also include increasing a bias voltage configured to be coupled to the MEMS microphone until a voltage glitch is detected from the MEMS microphone to determine a first voltage, determining a final DC bias voltage based on the first voltage, and applying the determined final DC bias voltage to the MEMS microphone.

Advantages of embodiments include better noise performance and lower power consumption compared to systems that control gain only by using a variable gain amplifier. Noise performance is improved because of the simple structure of the buffer amplifier or impedance converter, which may be implemented using, for example, a source follower. In some embodiments, the source follower transistor uses fewer active circuit components than a more complex amplifier, thereby generating less noise and consuming less power. Furthermore, in embodiments in which MEMS output signal is directly adjusted by the read-out circuitry, SNR is improved.

A further advantage of embodiments include the ability to trim out the effects of parametric variation, such as MEMS parameters (sensitivity, capacitances) variation of capacitive networks on the integrated circuit including variations in parasitic capacitances. Using embodiment calibration systems and methods, this variation may be calibrated out after assembly MEMS and integrated circuit have been assembled together.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system for amplifying a signal provided by a capacitive microphone, the system comprising:
    a voltage buffer having an input node configured to be coupled to a first terminal of the capacitive microphone and
    an adjustable capacitive network having a first node configured to be operatively coupled to a second terminal of the capacitive microphone and a second node operatively coupled to an output node of the voltage buffer.

2. The system of claim 1, wherein the adjustable capacitive network comprises:
    a first capacitor coupled between the first node and the second node, and
    a second capacitor coupled between the first node and a reference node, wherein at least one capacitor of the first capacitor and the second capacitor comprises an adjustable capacitor.

3. The system of claim 2, wherein the second node is a ground node.

4. The system of claim 2, wherein the adjustable capacitor comprises a plurality of capacitors selectively coupled in parallel via a corresponding plurality of switches.

5. The system of claim 4, wherein each of the plurality of capacitors comprises a top plate coupled to the first node of the capacitive network.

6. The system of claim 1, further comprising a gain control circuit configured to measure an amplitude of a signal at the output node of the voltage buffer and adjust a capacitance of the capacitive network based on the measured amplitude.

7. The system of claim 1, further comprising a calibration circuit coupled to the adjustable capacitive network, wherein the calibration circuit configured to adjust a capacitance of the adjustable capacitive network.

8. The system of claim 7, wherein the calibration circuit is further configured to:
increase a bias voltage configured to be coupled to the capacitive microphone until a voltage glitch is detected from the capacitive microphone to determine a first voltage;
determine a final DC bias voltage based on the first voltage; and
apply the determined final DC bias voltage to the capacitive microphone.

9. The system of claim 7, wherein the calibration circuit comprises a lookup table circuit.

10. The system of claim 7, wherein the calibration circuit comprises memory cells configured to store a calibration setting.

11. The system of claim 1, further comprising the capacitive microphone.

12. The system of claim 11, wherein the capacitive microphone is a MEMS microphone.

13. An integrated circuit for amplifying a signal provided by a MEMS microphone, the integrated circuit comprising:
a voltage buffer having an input node configured to be coupled to a first terminal of a MEMS microphone;
an adjustable capacitive network having a first node configured to be operatively coupled to a second terminal of the MEMS microphone, a second node operatively coupled to an output node of the voltage buffer, an adjustment input configured to adjust a capacitance of the adjustable capacitive network and a gain control circuit having an input node coupled to an output of the voltage buffer and an output coupled to the adjustment input of the adjustable capacitive network, the gain control circuit configured to measure an amplitude of a signal at the output of the voltage buffer and adjust the capacitance of the capacitive network based on the measured amplitude.

14. The integrated circuit of claim 13, wherein the voltage buffer comprises a MOS source follower.

15. The integrated circuit of claim 13, wherein the voltage buffer comprises a voltage gain of 1 or less.

16. The integrated circuit of claim 13, wherein the adjustable capacitive network comprises a first capacitor array comprising:
a plurality of first capacitors having first plates coupled to the first node of the adjustable capacitive network; and
a corresponding plurality of switches coupled to second plates of the first plurality of capacitors.

17. The integrated circuit of claim 16, wherein the first plates of the plurality of first capacitors comprise top plates of the plurality of first capacitors.

18. The integrated circuit of claim 13, wherein the adjustable capacitive network comprises:
a first adjustable capacitor coupled between the first node of the adjustable capacitive network and the second node of the adjustable capacitive network; and
a second adjustable capacitor coupled between the first node of the adjustable capacitive network and a reference node.

19. The integrated circuit of claim 13, the adjustable capacitive network comprises a plurality of capacitors, each having a top plate coupled to the first node of the adjustable capacitive network, and bottom plate, wherein the bottom plate of each of the plurality of capacitors is configured to be switchably coupled to a reference node and to the second node of the adjustable capacitive network.

20. The integrated circuit of claim 13, further comprising the MEMS microphone.

21. The integrated circuit of claim 13, further comprising an analog-to-digital converter coupled to the output of the voltage buffer.

22. A method of calibrating a MEMS microphone, the method comprising:
applying an acoustic signal to the MEMS microphone, the MEMS microphone having a first node operatively coupled to a signal input of a voltage buffer circuit;
measuring a sensitivity of the MEMS microphone and the voltage buffer circuit; and
correcting a gain of the MEMS microphone and the voltage buffer circuit, correcting the gain comprising adjusting a capacitance of a capacitive network operatively coupled between a signal output of the voltage buffer circuit and a second node of the MEMS microphone.

23. The method of claim 22, further comprising determining a difference between the measured sensitivity of the MEMS microphone and the voltage buffer circuit and a target output sensitivity.

24. The method of claim 22, wherein correcting the gain comprises selecting a switching configuration of a switchable capacitor array disposed within the capacitive network.

25. The method of claim 24, wherein selecting a switching configuration comprises configuring a digital lookup table.

26. The method of claim 22, further comprising:
increasing a bias voltage configured to be coupled to the MEMS microphone until a voltage glitch is detected from the MEMS microphone to determine a first voltage;
determining a final DC bias voltage based on the first voltage; and
applying the determined final DC bias voltage to the MEMS microphone.

27. The system of claim 1, wherein the voltage buffer comprises a MOS source follower.

* * * * *